(12) United States Patent
Kuniyoshi et al.

(10) Patent No.: US 7,586,316 B2
(45) Date of Patent: Sep. 8, 2009

(54) PROBE BOARD MOUNTING APPARATUS

(75) Inventors: Shinji Kuniyoshi, Tokyo (JP); Hidehiro Kiyofuji, Hirosaki (JP); Yuji Miyagi, Kuroishi (JP); Kiyotoshi Miura, Hirakawa (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 0 days.

(21) Appl. No.: 12/039,027

(22) Filed: Feb. 28, 2008

(65) Prior Publication Data
US 2008/0315905 A1 Dec. 25, 2008

(30) Foreign Application Priority Data
Mar. 5, 2007 (JP) .............................. 2007-054259

(51) Int. Cl.
G01R 31/02 (2006.01)
(52) U.S. Cl. .................. 324/754; 324/761; 324/762; 439/66
(58) Field of Classification Search .................. None
See application file for complete search history.

(56) References Cited

U.S. PATENT DOCUMENTS

| | | |
|---|---|---|
| 6,509,751 B1 | 1/2003 | Mathieu et al. |
| 7,230,437 B2 * | 6/2007 | Eldridge et al. ............. 324/754 |
| 2008/0122466 A1 * | 5/2008 | Miyagi et al. ................ 324/754 |
| 2008/0122467 A1 * | 5/2008 | Miyagi et al. ................ 324/754 |

FOREIGN PATENT DOCUMENTS

| | | |
|---|---|---|
| JP | 2001-569861 | 9/2003 |
| JP | 2003-528459 | 9/2003 |
| WO | WO 01/71779 A2 | 9/2001 |
| WO | WO 2006/126279 A1 | 11/2006 |

* cited by examiner

Primary Examiner—Minh N Tang
(74) Attorney, Agent, or Firm—Bruce A. Jagger

(57) ABSTRACT

A mounting apparatus that does not compromise the strength of a probe board. The apparatus comprises a probe board spaced from a support member by a spacer. A fixed portion with a female screw hole is mounted on one surface of the probe board. A male screw member is threaded into the screw hole for the purpose of tightening the support member to the probe board at a fixed distance defined by the length of the spacer. The probe board has a support plate. Pluralities of conductive paths penetrate the support plate. A wiring plate wherein wiring paths are connected to corresponding conductive paths, and whose one surface is fixed to the support plate. The other surface is provided with probes corresponding to the wiring paths. The fixed portion includes a female screw member at an area where no conductive paths are formed.

8 Claims, 4 Drawing Sheets

PROBE BOARD MOUNTING APPARATUS

RELATED APPLICATIONS

This application claims the benefit of Japanese Patent Application No. 2007-54259, filed Mar. 5, 2007.

BACKGROUND OF THE INVENTION

The present invention relates to an electrical connecting apparatus such as a probe card to be used for an electrical test of an electrical circuit to connect, for example, an integrated circuit as a device under test to a tester that performs an electrical test of it.

As one of the conventional electrical connecting apparatuses of this kind is proposed an electrical connecting apparatus comprising a probe board provided with a plurality of probes and enabling adjustment of the planarity of the probe board Japanese Unexamined Patent Publication No. 2003-528459). With this electrical connecting apparatus, a thrusting force or a tensile force can act from a support member supporting the probe board toward a part of the probe board. Adjustment of this acting force can correct bend and deformation of the probe board even if the probe board is bent to maintain the planarity of the probe board.

Accordingly, since the planarity of the probe board can be maintained by the aforementioned adjustment work after the probe board has been attached to the support member even if the probe board is bent and deformed at the time of manufacture of the probe board provided with the plurality of probes, the tips of the plurality of probes extending from the probe board can be held on the same plane. Thus, since the tips of all the probes can reliably contact electrical connecting terminals, corresponding to the respective probes, of an electrical circuit as a device under test, efficient electrical contact can be attained between them.

However, in the aforementioned prior art described in Japanese Unexamined Patent Publication No. 2003-528459, adjustment is needed every time of the probe board is attached to the support member in accordance with bend and deformation introduced in each probe board so that all the probe tips may be located on the same plane. The adjustment work to let all the probe tips appropriately contact the aforementioned corresponding respective electrical connecting terminals of the device under test in a state where the probe board is attached to the support member is troublesome and requires skills. Especially, in a test of numerous integrated circuits formed on a semiconductor wafer, the number of probes to be provided on the probe board significantly increases. Thus, the adjustment work to let such numerous probes appropriately contact the corresponding respective pads on the semiconductor wafer is not easy.

Under such circumstances, the present applicant proposed in a prior International Patent Application (PCT/JP2005/009812) an electrical connecting apparatus that requires no planarity adjustment work of the probe board after being attached to the support member regardless of the deformation of the probe board and enables reliable electrical connection between the probes and the corresponding electrical connecting terminals of the electrical circuit as a device under test.

In this electrical connecting apparatus, a spacer allowing an attachment bolt to pass therethrough is arranged between the attachment surface of the support member and the probe board so that the tips of the probes provided on the probe board are aligned on the same surface. The tip of this attachment bolt is screwed in a screw hole in a fixed portion formed on an opposite surface of a surface of the probe board on which the probes are provided. The aforementioned spacer acts to keep predetermined space between the attachment surface of the support member and the probe board so that the probe tips are located on the same surface at the time of tightening of the attachment bolt.

Thus, after the probe board is attached to the support member, the tips of all the probes can be thrust to the respective electrical connecting terminals of the electrical circuit as a device under test approximately uniformly without the need for the conventional adjustment work for planarization of the probe board. As a result, the aforementioned conventional troublesome planarity adjustment work is not needed per replacement of the probe board provided with the plurality of probes, which enables an efficient electrical test.

Meanwhile, such a probe board is formed by combining a wiring plate in which wiring paths are formed in a multilayered form and to which the probes are provided per corresponding wiring path with a support plate such as a ceramic plate supporting the wiring plate at the opposite surface of the surface to which the probes are provided. Numerous conductive paths referred to as through holes are formed to pass through the ceramic plate as the support plate of the probe board in the plate thickness direction for electrical paths for the corresponding probes. Also, on the ceramic plate is formed the fixed portion in which the tip of the aforementioned attachment bolt is screwed.

This fixed portion is formed by fixing a female screw member at an area where unnecessary ones out of the through holes or conductive paths formed in the ceramic plate are provided. Accordingly, when a strong tensile force acts on the female screw member forming the fixed portion at the time of and as a result of tightening of the aforementioned attachment bolt, a portion of the ceramic plate fixed by the female screw member is tensed by the female screw member. Since the rim portion of the through hole under the female screw member of the ceramic plate can be a fragile portion of the probe board against this tensile force, heightening of the mechanical strength of the probe board has been desired.

BRIEF SUMMARY OF THE INVENTION

It is an object of the present invention to provide an electrical connecting apparatus that does not cause lack of mechanical strength in the support plate of the probe board.

The present invention focuses attention on the fact that numerous unused conductive paths exist in the support plate of the probe board such as the ceramic plate and is characterized by forming in this support plate an area where no conductive paths are arranged and forming at this area where no conductive paths are arranged a fixed portion in which a male screw member is screwed.

More specifically, an electrical connecting apparatus according to the present invention comprises a support member, a flat plate shaped probe board spaced from one surface of the support member, arranged with its one surface opposed to the support member, and provided on its other surface with numerous probes that are connected to a tester and whose tips can abut on electrode terminals of a device under test for an electrical test by the tester, a fixed portion formed on one surface of the probe board and provided with an opened screw hole at its top portion, a cylindrical spacer keeping a distance from the support member to a top surface of the fixed portion, and a male screw member that penetrates the support member and whose tip is screwed in the screw hole of the fixed portion for the purpose of tightening the support member and the probe board at a distance in accordance with the length of the spacer. The probe board has a support plate in which a plurality of conductive paths penetrating in the plate thickness direction and connected to the tester are formed and a wiring plate in which wiring paths are formed, whose one surface is fixed to the support plate so as to let the wiring paths connected to the corresponding conductive paths, and on the other surface of which are provided the probes corresponding to the wiring paths, and on one surface of the support plate is fixed a female screw member to form the fixed portion. This female screw member is characterized by being fixed to the support plate at an area of the support plate where no conductive paths are formed.

In the electrical connecting apparatus according to the present invention, the female screw member is fixed to the support plate at a solid area where no conductive paths such as through holes are formed. Thus, the rim portion of the through hole housing the conductive path of the support plate will not be fixed to the female screw member. Accordingly, even when tightening by the male screw member acts on the female screw member, this tightening force will not act on the rim portion of the through hole housing the conductive path of the support plate. Thus, since no strong tensile force will act on the rim portion of the through hole, which is a fragile portion against the aforementioned tightening force, via the female screw member, it is possible to prevent breakages from occurring on the support plate as a result of this tensile force. Consequently, the mechanical strength of the support plate is heightened The female screw member may be a metal nut. In such a case, the female screw member may be fixed to the support plate via a metal film. As this metal film, a part of a wiring layer formed in the support plate may be utilized. On this metal film utilizing the wiring layer, the female screw member that is the metal nut may be fixed firmly by brazing or by using adhesive.

The support plate may be constituted by a ceramic plate. Also, another electrical insulating plate having approximately the same Young's modulus as that of this ceramic plate may be used as the support plate.

As the spacer, a spacer having a head portion whose lower surface is mounted on the other surface of the support member and a body portion whose one edge is connected to the head portion, that is arranged to pass through a through hole formed in the support member, and whose other edge is arranged to abut on the top surface of the fixed portion may be used. The spacer may be given a length dimension required to align the height locations of tips of the probes on the same virtual surface by collaborating with the fixed portion.

It is preferable that the spacer is prevented from moving in the axial direction of the body portion in relation to the support member by releasable lock means. Instead of this lock means, the spacer may be screwed in the support member.

As the spacer, a spacer whose distance from the lower surface of the head portion to the other edge of the body portion is applicable to maintain the tips of the probes on the same virtual plane may be selected and used in accordance with variation within process tolerance of the top surface of the fixed portion.

Between the support member and the probe board, a wiring board having a wiring path to be connected to the tester and having a through hole that allows the spacer to pass therethrough may be arranged. Also, between the wiring board and the probe board, a connector having a through hole that allows the spacer to pass therethrough and connecting the wiring path of the wiring board to the corresponding conductive path of the support plate may be arranged. In such a case, the spacer may be arranged to pass through the respective through holes of the wiring board and the connector. Also, the male screw member is applied so that its tip may be screwed in the screw hole of the fixed portion of the probe board.

As the connector, a pogo pin connector having a pogo pin contactor as a contactor may be used.

According to the present invention, since there are no conductive paths such as through holes directly under the fixed portion formed on the support plate, but the solid portion of the support plate is located there, the mechanical strength of a portion of the probe board supporting the fixed portion can be heightened. Thus, even when the conventional strong tightening force acts on the fixed portion by the male screw member screwed in the fixed portion, it is possible to prevent damage such as breakages from occurring at the portion of the probe board supporting the fixed portion by this tightening force, which can improve durability of the electrical connecting apparatus.

DETAILED DESCRIPTION OF THE INVENTION

Figure 1:
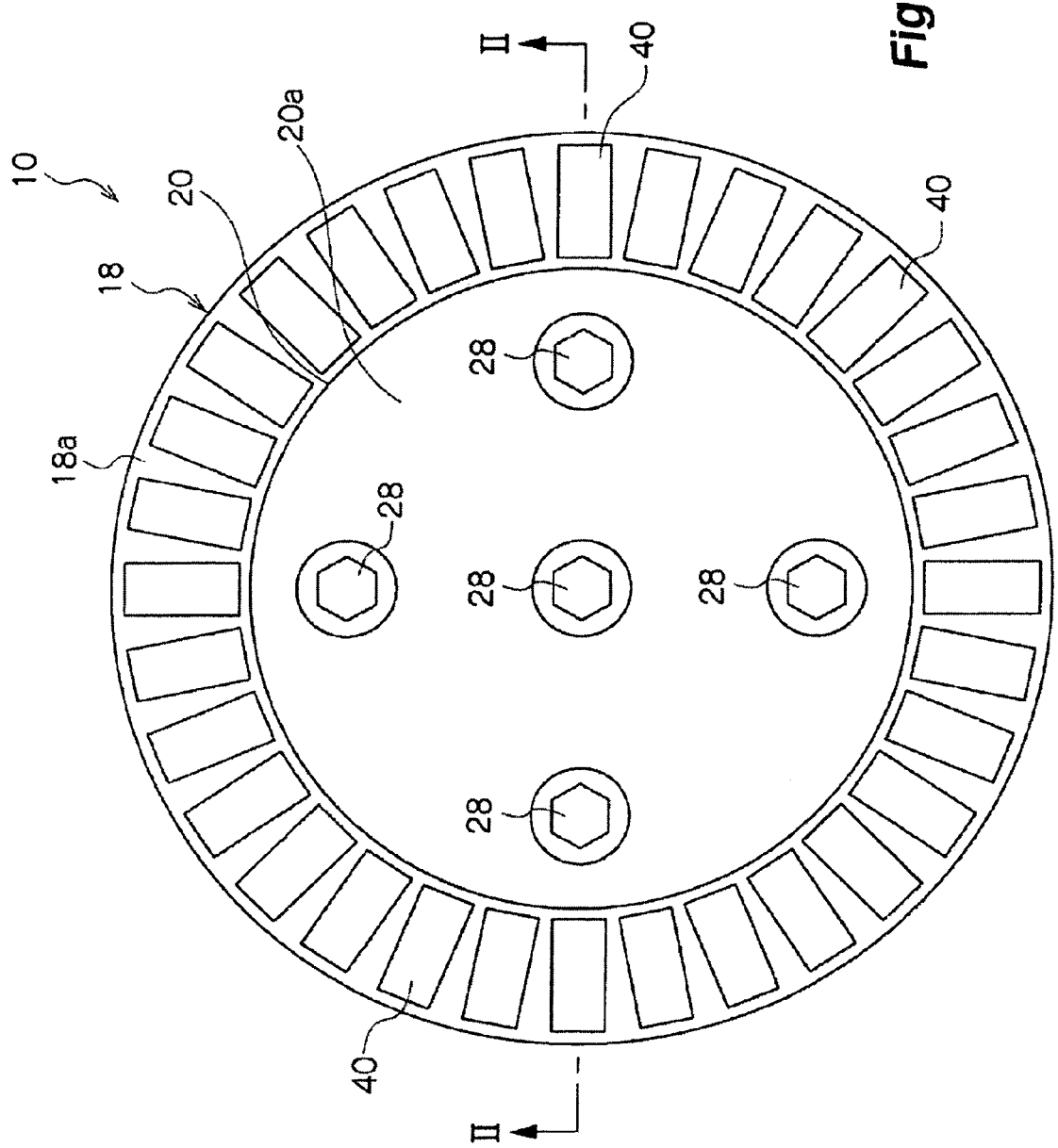
FIG. 1 is a plan view showing an electrical connecting apparatus according to the present invention.
Figure 2:
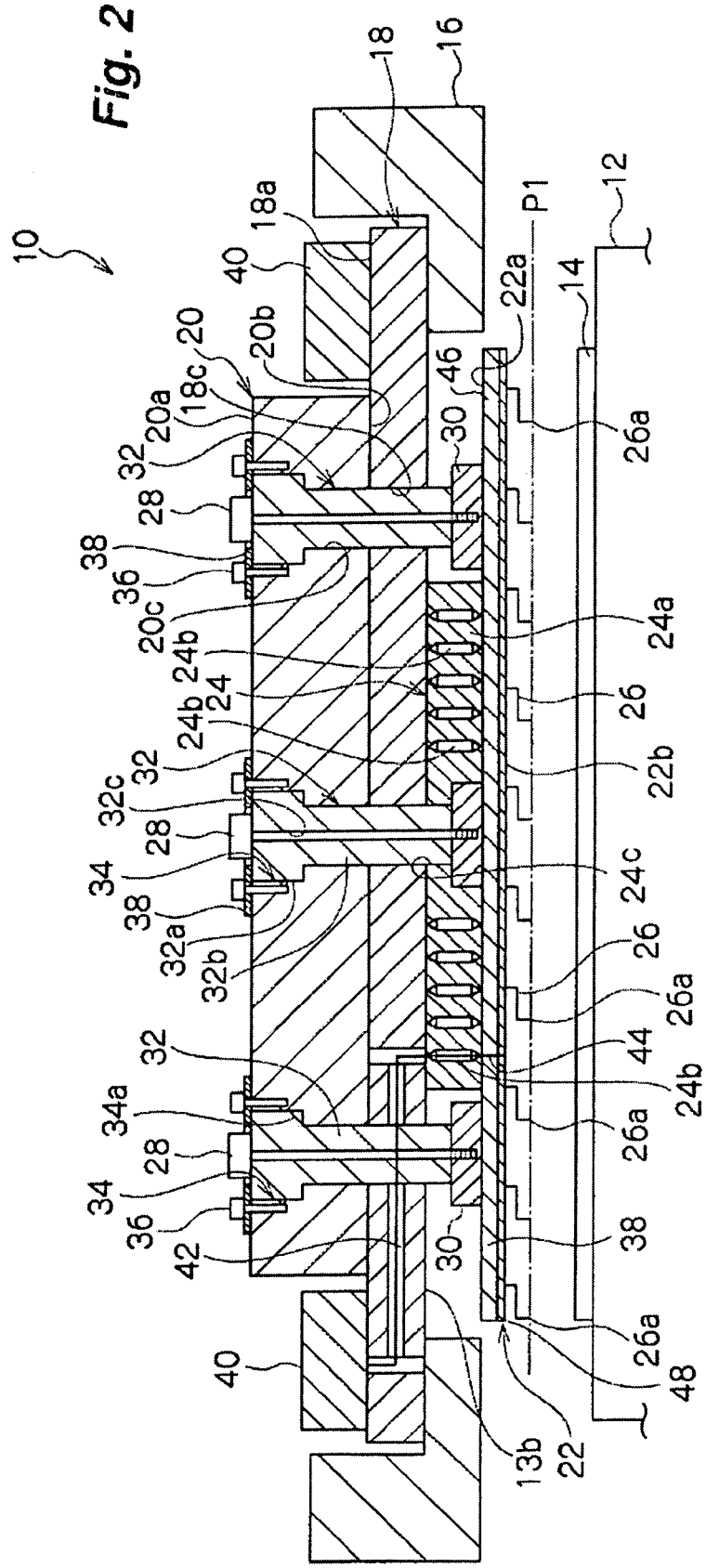
FIG. 2 is a cross-sectional view obtained along the line II-II shown in FIG. 1.

An electrical connecting apparatus 10 according to the present invention is shown in FIGS. 1 and 2. This electrical connecting apparatus 10 is used in an electrical test of a semiconductor wafer 14 on a conventionally well-known vacuum chuck 12 constituting a stage of a tester as shown in FIG. 2, for example. In the semiconductor wafer 14 are integrated not shown numerous IC circuits, and for an electrical test of these IC circuits, the electrical connecting apparatus 10 is used to connect the respective connection pads of the respective IC circuits to an electrical circuit of a tester main body (not shown).

The electrical connecting apparatus 10 is used, being attached to a tester head of the aforementioned tester, for example. The electrical connecting apparatus 10 comprises a circular flat plate shaped wiring board 18 whose rim portion is held at an annular card holder 16 provided to the aforementioned tester head, a circular flat plate shaped support member 20 attached to an upper surface 18a of the wiring board, a probe board 22 arranged to be spaced from a lower surface 18b of the wiring board 18, and an electrical connector 24 arranged between the lower surface 18b of the wiring board 18 and an upper surface 22a of the probe board facing the lower surface, as shown in FIG. 2.

On a lower surface 22b of the probe board 22 are provided numerous probes 26. Each probe 26 corresponds to aforementioned each connection pad provided in the aforementioned IC circuit on the semiconductor wafer 14. As this probe 26, various kinds of conventional well-known probes such as a needle type, a blade type, or a pogo pin type instead of a cantilever type shown in the figure may be used.

The support member 20, wiring board 18, electrical connector 24, and probe board 22 are combined integrally by male screw members 28 such as bolts with tips 26a of the probes 26 provided on the probe board directing downward. For this combination, each male screw member 28 is arranged to extend through the support member 20, wiring board 18, and electrical connector 24 from an upper surface 20a side of the support member 20, and its tip is screwed in a fixed portion 30 formed on the upper surface 22a of the probe board 22. This fixed portion 30 is formed by a female screw member 30 as described later.

The male screw member 28 is equipped with a cylindrical spacer 32 whose tip abuts on the top surface of the fixed portion 30. The spacer 32 has a head portion 32a and a body portion 32b whose one edge is connected to the head portion, and a through hole 32c penetrating the head portion 32a and the body portion 32b and allowing the male screw member 28 to pass therethrough is formed. The spacer 32 is arranged to pass through respective through holes 20c and 18c provided in the support member 20 and the wiring board 18, and the spacer 32 located at the center is arranged to pass through a through hole 24c of the electrical connector 24 as well.

In the example shown in FIG. 2, on the upper surface 20a of the support member 20 is formed a recess 34 to receive the head portion 32a, and the lower surface of the head portion 32a is mounted on a bottom surface 34a of the recess 34 so that the upper surface of the head portion 32a may correspond to the upper surface 20a in the recess. The other edge or lower edge of the body portion 32b of the spacer 32 abuts on the top surface of the fixed portion 30. Also, the upper surface of the head portion 32a abuts on the inner rim portion of an annular lock tool 38, for example, removably fixed on the upper surface 20a with male screw members 36 screwed in the support member 20 as shown in FIG. 2 although the male screw members 36 are omitted in FIG. 1 for simplification of the drawing. This prevents the spacer 32 from moving in its axial direction in relation to the support member 20.

The spacer 32 having a length dimension required to align the respective tips 26a of the probes 26 on a virtual plane P1 parallel to the lower surface 20b of the support member 20 as a reference plane when the tip of the male screw member 28 inserted in each spacer 32 is screwed in the fixed portion 30, and the male screw member 28 is tightened, is selected in accordance with the applicable position in each case. More specifically, the spacer 32 whose distance from the lower surface of the head portion 32a of the spacer 32 to the lower edge of the body portion 32b is applicable to maintain the tips 26a of the probes 26 on the same virtual plane P1 is selected and used in accordance with bend of the probe board 22 or variation such as process tolerance of the top surface of the fixed portion 30.

The wiring board 18 is a printed circuit board (PCB) similar to a conventional wiring board, and as shown in FIG. 1, the annular rim portion of its upper surface 18a is exposed from the outer rim of the support member 20 arranged concentrically with the wiring board 18. At this exposed rim portion, a plurality of sockets 40 constituting connectors to the aforementioned tester are arranged annularly.

Referring to FIG. 2 again, in the wiring board 18 are formed a plurality of wiring paths 42 corresponding to the respective sockets 40. In FIG. 2, one of them is shown representatively and schematically. Each wiring path 42 extends from the upper surface 18a to the lower surface 18b of the wiring board 18 and is connected to the corresponding socket 40 at its upper surface 18a. Also, the wiring path 42 is connected to the corresponding probe 26 of the probe board 22 via the electrical connector 24 at the lower surface 18b.

The electrical connector 24 disposed between the wiring board 18 and the probe board 22 is a well-known pogo pin connector in the example shown in FIG. 2. This pogo pin connector 24 comprises a pogo pin block 24a inserted between the wiring board 18 and the probe board 22 and a plurality of pogo pins 24b embedded in the pogo pin block. The aforementioned through hole 24c of the electrical connector 24 receiving the spacer 32 is formed in the pogo pin block 24a in the plate thickness direction. Each pogo pin 24b of the electrical connector 24 electrically connects the wiring path 42 provided in the wiring board 18 with a wiring path 44 provided in the probe board 22 corresponding to it.

To each wiring path 44 is connected each corresponding probe 26. Thus, since each probe 26 of the probe board 22 is connected to the socket 40 via the wiring path 44 of the probe board 22, the pogo pin 24b of the electrical connector 24, and the wiring path 42 of the wiring board 18, it is connected to the electrical circuit of the tester main body via an electrical wire connected to the socket. Accordingly, by letting the tip 26a of each probe 26 contact aforementioned each corresponding connection pad of the semiconductor wafer 14, the electrical test of the aforementioned IC circuit integrated in the semiconductor wafer 14 can be performed.

Figure 3:
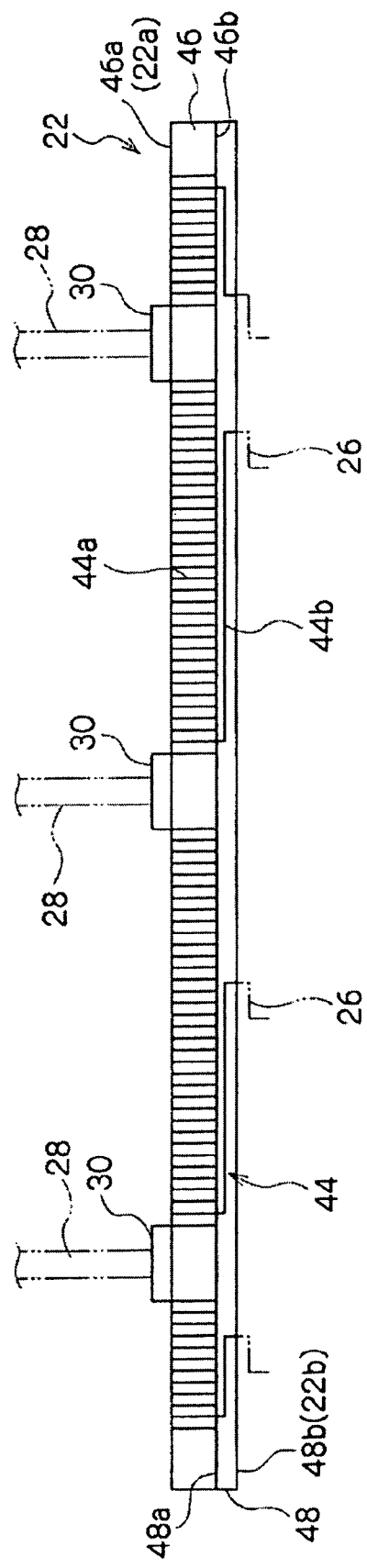
FIG. 3 is an enlarged cross-sectional view showing the probe board shown in FIG. 2.

FIG. 3 is a cross-sectional view showing a specific example of the probe board 22. In the example shown in FIG. 3, the probe board 22 has a support plate 46 such as a ceramic plate, for example, having an upper surface 46a opposed to the lower surface 18b of the wiring board 18 and a wiring plate 48 such as a resilient multilayered wiring board, for example, fixed to a lower surface 46b of the support plate.

The support plate 46 has an approximately uniform thickness dimension, and numerous conductive paths 44a are formed in the plate thickness direction. This conductive path 44a is formed by a hollow through hole having a conductive layer made of a metal layer, for example, formed by covering the peripheral wall of a through hole formed in the plate thickness direction of the support plate 46 or a solid through hole made of a conductive member filling the aforementioned through hole, as is conventionally well known although not shown in the figure. The conductive path 44a is connected to the lower edge of the corresponding pogo pin 24b of the electrical connector 24 at the upper surface 46a of the support plate 46.

Figure 4:
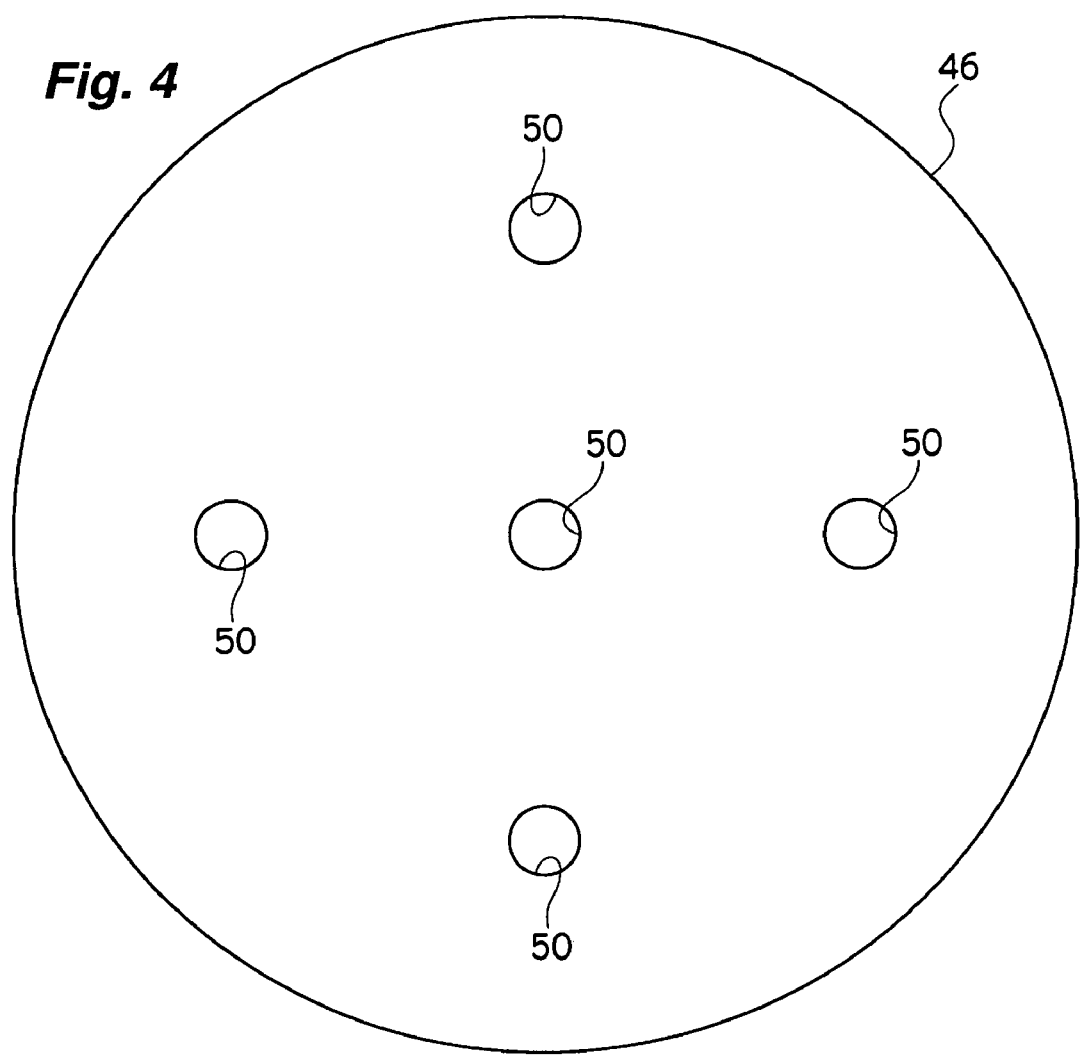
FIG. 4 is a plan view of the probe board shown in FIG. 3.

Since the through holes are formed in the support plate 46 regardless of whether this conductive path 44a is the aforementioned hollow through hole or the solid through hole, this lowers the strength of the support plate. Thus, in the present invention, the through holes or conductive paths 44a are arranged to be distributed approximately evenly at an area except the arrangement area of the female screw members 30 forming the fixed portions 30, as shown in FIGS. 3 and 4. In FIG. 4, the circular areas shown as a numeral 50 represent locations of the fixed portions 30 or female screw members 30, and in the flat surface area (upper surface 46a, 46b) except these circular areas 50 are formed the numerous through holes 44a to be distributed evenly and to penetrate the support plate 46 in the plate thickness direction.

The female screw member 30 is a metal nut, for example, and is fixed with adhesive, for example, at the circular area 50 where no through holes 44a are formed on the upper surface 46a of the support plate 46 so that the tip of the male screw member 28 may be screwed in a not shown screw hole. Instead of the adhesive, the metal nut 30 may be fixed on the upper surface 46a by brazing. In such a case, a metal layer is formed at the circular area 50 in relation to formation of the conductive paths 44a, and the metal nut 30 is brazed at the metal layer.

As for the wiring plate 48, its upper surface 48a is fixed to the lower surface 46b of the support plate 46. On a lower surface 48b of the wiring plate 48 are fixed the aforementioned probes 26. Also, in the wiring plate 48 are formed wiring paths 44b corresponding to the probes 26. Thus, the conductive path 44a or through hole 44a of the support plate 46 and the wiring path 44b of the wiring plate 48 collaborate with each other to constitute the wiring path 44 of the probe board 22 extending from the upper surface 22a of the probe board 22 (upper surface 46a of the support plate 46) to the lower surface 22b of the probe board 22 (lower surface 48b of the wiring plate 48).

In the electrical connecting apparatus 10 according to the present invention, the probe board 22 is constituted by the support plate 46 in which the conductive paths 44a or through holes 44a are formed and the wiring plate 48 whose upper surface 48a is fixed to the support plate 46, whose lower surface 48b is provided with the probes 26, and in which the wiring paths 44b each forming the wiring path 44 to the probe 26 together with the through hole 44a are provided. While the through holes 44a are formed in the support plate 46, the female screw members 30 forming the fixed portions 30 are fixed to the probe board 22 at the circular areas 50 where no through holes 44a are formed, as described above.

Accordingly, even when tightening by the male screw member 28 acts on the female screw member 30, this tightening force will not act on the rim portion of the through hole 44a of the support plate 46 since no through holes 44a are formed under the female screw member. Thus, since no strong tensile force will act on the rim portion of the through hole 44a, which is a fragile portion against the aforementioned tightening force, via the female screw member 30, it is possible to prevent breakages such as chips or cracks from occurring on the support plate 46 as a result of this tensile force. Consequently, the mechanical strength of the support plate 46 is heightened, and durability of the probe board 22 and thus the electrical connecting apparatus 10 can be improved.

A resin nut made of a resin material may be used as the female screw member 30. Also, another electrical insulating plate having approximately the same Young's modulus as that of the ceramic plate may be used as the support plate 46.

An example in which the spacer 32 is prevented from moving in its axial direction by the releasable lock means consisting of the male screw members 36 and the lock tool 38 has been shown. Instead of this lock means (36, 38), a male screw portion may be formed at the spacer 32, a female screw groove corresponding to the aforementioned male screw portion may be formed at the recess 34 or the through hole 20c of the support member 20, and by the screwing relationship between them, the spacer 32 may be prevented from moving in its axial direction in relation to the support member 20.

The present invention is not limited to the above embodiments but may be altered in various ways without departing from the spirit and scope of the present invention. For example, as the electrical connector, another electrical connector such as a wire connector may be applied, instead of the pogo pin assembly.

What is claimed is:

1. An electrical connecting apparatus comprising:
   a support member,
   a flat plate shaped probe board spaced from one surface of said support member, arranged with its one surface opposed to said support member, and provided on its other surface with numerous probes that are connected to a tester and whose tips are capable of abuting on electrode terminals of a device under test for an electrical test by said tester;
   a fixed portion formed on said one surface of said probe board and provided with a screw hole;
   a cylindrical spacer capable of positioning said support member at a fixed distance from a top surface of said fixed portion; and
   a male screw member that is moveable with respect to said cylindrical spacer and that penetrates said support member and said cylindrical spacer and whose tip is capable of being screwed into said screw hole to tighten said support member to said probe board at said distance in accordance with the length of said cylindrical spacer,
   wherein said probe board has a support plate in which a plurality of conductive paths that penetrate the plate and connect to said tester are formed and a wiring plate in which wiring paths are formed, whose one surface is fixed to said support plate so as to let said wiring paths be connected to corresponding said conductive paths, and on the other surface of which are provided said probes corresponding to said wiring paths, and on said one surface of said support plate is fixed a female screw member to form said fixed portion, and
   wherein said female screw member is fixed to said support plate at an area of said support plate where no said conductive paths are formed.

2. The electrical connecting apparatus according to claim 1, wherein said female screw member is a metal nut and is fixed to said support plate via a metal film.

3. The electrical connecting apparatus according to claim 1, wherein said support plate is a ceramic plate.

4. The electrical connecting apparatus according to claim 1, wherein said cylindrical spacer has a head portion whose lower surface is mounted on the other surface of said support member and a body portion whose one edge is connected to said head portion, that is arranged to pass through a through hole formed in said support member, and whose other edge is arranged to abut on the top surface of said fixed portion, and said cylindrical spacer has a length dimension required to align the height locations of said tips of said probes on the same virtual surface by collaborating with said fixed portion.

5. The electrical connecting apparatus according to claim 4, wherein said cylindrical spacer is prevented from moving in the axial direction of said body portion in relation to said support member by a releasable lock member.

6. The electrical connecting apparatus according to claim 5, wherein said cylindrical spacer has a length from said lower surface of said head portion to said other edge of said body portion that is applicable to maintain said tips of said probes on the same virtual plane, and said cylindrical spacer is selected and used in accordance with variation within process tolerance of the top surface of said fixed portion.

7. The electrical connecting apparatus according to claim 1, wherein between said support member and said probe board is arranged a wiring board having a wiring path to be connected to said tester and having a through hole that allows said cylindrical spacer to pass therethrough, and between said wiring board and said probe board is arranged a connector having a through hole that allows said cylindrical spacer to pass therethrough and connecting said wiring path of said wiring board to said corresponding conductive path of said support plate, and said cylindrical spacer is arranged to pass through said respective through holes of said wiring board and said connector, and said male screw member is applied so that its tip is screwed in said screw hole of said fixed portion of said probe board.

8. The electrical connecting apparatus according to claim 7, wherein said connector is a pogo pin connector having a pogo pin contactor as a contactor.

* * * * *